(12) United States Patent
Lee et al.

(10) Patent No.: US 7,428,169 B2
(45) Date of Patent: Sep. 23, 2008

(54) NONVOLATILE SEMICONDUCTOR MEMORY DEVICE AND VOLTAGE GENERATING CIRCUIT FOR THE SAME

(75) Inventors: Doo-Sub Lee, Suwon-si (KR); Seung-Keun Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 11/262,759

(22) Filed: Nov. 1, 2005

(65) Prior Publication Data

US 2006/0133147 A1    Jun. 22, 2006

(30) Foreign Application Priority Data

Dec. 20, 2004    (KR) .................... 10-2004-0108793

(51) Int. Cl.
*G11C 16/04* (2006.01)

(52) U.S. Cl. .................... 365/185.18; 365/189.09; 365/204; 257/299; 375/374; 327/144; 327/148

(58) Field of Classification Search ............ 365/185.18, 365/189.09, 204; 257/299; 375/374; 327/144, 327/148
See application file for complete search history.

(56) References Cited

U.S. PATENT DOCUMENTS

| | | | | |
|---|---|---|---|---|
| 5,491,657 | A * | 2/1996 | Haddad et al. ......... | 365/185.27 |
| 6,125,056 | A * | 9/2000 | Chen et al. ............ | 365/185.18 |
| 6,891,764 | B2 * | 5/2005 | Li ........................ | 365/189.09 |
| 7,072,238 | B2 * | 7/2006 | Chae et al. ............. | 365/226 |
| 7,173,840 | B2 * | 2/2007 | Krause et al. .......... | 365/63 |
| 2006/0186947 | A1 * | 8/2006 | Lin et al. .............. | 327/536 |

FOREIGN PATENT DOCUMENTS

| | | |
|---|---|---|
| JP | 10-247386 | 9/1998 |
| JP | 10-255469 | 9/1998 |
| JP | 2000-049299 | 2/2000 |
| KR | 1020000030505 A | 6/2000 |
| KR | 2000-0043892 | 7/2000 |
| KR | 1020030049451 | 6/2003 |
| KR | 1020040002132 A | 1/2004 |

* cited by examiner

*Primary Examiner*—Son Dinh
*Assistant Examiner*—Eric Wendler
(74) *Attorney, Agent, or Firm*—Volentine & Whitt, PLLC.

(57) ABSTRACT

A nonvolatile semiconductor memory device includes a memory cell array of a plurality of memory cells; and a voltage generating circuit for generating a programming voltage to be applied to the memory cells. The voltage generating circuit includes a first voltage generating unit for generating a negative voltage through a first charge pump; and a second voltage generating unit for generating a positive voltage through a second charge pump. During an accelerated programming operation, the first voltage generating unit increases a pumping efficiency of the first charge pump using an external power supply voltage, and the second voltage generating unit directly outputs the external power supply voltage.

31 Claims, 6 Drawing Sheets

NONVOLATILE SEMICONDUCTOR MEMORY DEVICE AND VOLTAGE GENERATING CIRCUIT FOR THE SAME

BACKGROUND OF THE INVENTION

1. Field of the Invention

The present invention relates to a nonvolatile semiconductor memory device, and more particularly to a voltage generating circuit capable of increasing a current capacity according to an operation mode of a nonvolatile semiconductor memory device.

2. Description of the Related Art

Semiconductor memories are usually considered to be the most vital microelectronic component of digital logic system design, such as computers and microprocessor-based applications ranging from satellite to consumer electronics. Therefore, advances in the fabrication of semiconductor memories including process enhancements and technology developments through the scaling for higher densities and faster speeds help establish performance standards for other digital logic families.

Semiconductor memories are classified into volatile semiconductor memories and non-volatile semiconductor memories. In the volatile semiconductor memories, data are stored and can be read out as long as the power is applied, and are lost when the power is turned off. On the other hand, non-volatile memories such as a MROM (MASK ROM), a PROM (Programmable ROM), an EPROM (Erasable and Programmable ROM), and an EEPROM (Electrically Erasable and Programmable ROM) are capable of storing data even with the power turned off. Flash memories are widely used in computers and memory cards because of their capability to for electrically and collectively erase data of cells.

Flash memories are classified into NOR-type flash memories and NAND-type flash memories according to a connection structure of a cell and a bitline. The NOR-type flash memory has a structure wherein two or more cell transistors are connected to a bitline in parallel. In the NOR-type flash memory, data is stored using channel hot electron mechanism and erased using F-N tunneling mechanism. The NAND-type flash memory has a structure wherein more than two cell transistors are connected to a bitline in series. Data are stored and erased using F-N tunneling mechanism. The NOR-type flash memory can be easily adapted to high-speed and is disadvantageous in high-integration because of its high power consumption. The NAND-type flash memory is advantageous in high-integration because it uses less current than the NOR-type flash memory.

FIG. 1 is a cross-sectional view of a flash memory cell. The flash memory cell is comprised of source/drain regions 3 and 4 which are doped with N+ impurities and formed on a P-type semiconductor substrate 2 with a channel region interposed therebetween. The floating gate 6 is formed on the channel region with thin insulating layer 7 of 100 Å or less interposed therebetween on the channel region. A control gate 8 is formed on the floating gate 6 with an insulating layer 9 interposed therebetween. In order to apply voltages for programming, erasing, and reading, power supply terminals Vb, Vs, Vd, and Vg are respectively connected to the substrate 2, the source 3, the drain 4, and the control gate 8.

In general, flash memories are programmed by channel hot electron injection (CHE) where hot electrons are generated from the channel region adjacent to the drain region 4 and are injected to the floating gate 6. In order to program a cell by channel hot electron injection, a high voltage of about 10V is applied to a wordline (floating gate 6) of a selected cell, and a voltage (e.g., 4V~6V) suitable for generating a hot electron is applied to a bitline (drain) of a selected cell. And, the source region 3 is grounded to the semiconductor substrate 2, or a negative bulk voltage is applied to the semiconductor substrate 2. In this case, the applied wordline voltage, bitline voltage, and bulk voltage are generated through a charge pump in a chip, respectively. If flash memory cells are programmed under the condition of the above voltage application, a negative charge is sufficiently accumulated in the floating gate 6. While a series of read out operations are carried out, the negative charge accumulated in floating gate 6 performs a function to enhance a threshold voltage of the programmed flash memory cell.

FIG. 2 is a waveform of a programming voltage of a conventional NOR-type flash memory device. In FIG. 2, a bitline voltage VBL applied to a drain of a selected cell and a bulk voltage VBulk applied to a substrate of a selected cell are shown, respectively. Where, a bitline voltage denoted by VPBL represents a pumping voltage generated from a bitline pump circuit, and a bitline voltage denoted by VBL represents a voltage actually applied to a bitline.

For programming of flash memories, a bitline current (or a programming current) above a predetermined level is required because a high voltage of about 4V to 6V is applied to the drain of the memory cell. In particular, during an accelerated programming operation in which a plurality of memory cells (e.g., four times as many memory cells as in a normal programming operation) are programmed at once, a required bitline current in a selected bitline is increased more and more. As a desired amount of bitline current is increased, a sub-current amount is also increased. As a result, a level of the bulk voltage VBulk is enhanced. Accordingly, there is a problem that a programming operation is not performed normally.

Typical method for increasing a bitline current amount is to enhance a level of a pumping voltage by adding the number of stages of a pump circuit. According to this method, a layout area occupied by the pump circuit is spread. Since the accelerated programming operation is performed in a factory circumstance so as to reduce a programming time of NOR-type flash memories, the pump circuit with increased layout area is useless in normal circumstances.

Therefore, there is an increasing demand for a method capable of providing a sufficient current capacity required during an accelerated programming operation without increasing a chip size.

Accordingly, it would be desirable to provide a voltage generating circuit capable of providing a current capacity required for an accelerated programming operation without increasing a chip size. It would also be desirable to provide a non-volatile semiconductor memory device including such a circuit. It would further be desirable to provide a voltage generating circuit capable of providing a high programming reliability and a non-volatile memory device including it.

SUMMARY OF THE INVENTION

In one aspect of the invention, a nonvolatile semiconductor memory device comprises: a memory cell array of a plurality of memory cells; and a voltage generating circuit for generating a programming voltage to be applied to the memory cells, wherein the voltage generating circuit includes: a first voltage generating unit for generating a negative voltage through a first charge pump; and a second voltage generating unit for generating a positive voltage through a second charge pump, and wherein during an accelerated programming operation, the first voltage generating unit increases a pumping efficiency of the first charge pump using an external voltage, and the second voltage generating unit directly outputs the external voltage.

In one embodiment, the first voltage generating unit comprises: the first charge pump for performing a charge pumping operation in response to the clock signal; a first regulator for setting a voltage of a clock signal; a first pump driver for controlling a phase and a magnitude of the clock signal; and a first level detector for detecting an output level of the first charge pump to control the applying of the clock signal to the first pump driver. During the accelerated programming operation, the first regulator raises the clock voltage to a predetermined level using an external power supply voltage, and the first pump driver controls the magnitude of the clock signal to correspond to the clock voltage.

In one embodiment, the first pump driver outputs the clock signal as complementary first and second charge pump clock signals having opposite phases with respect to each other.

In one embodiment, during a normal programming operation the first pump driver generates the first and second charge pump clock signals having a magnitude corresponding to an internal power supply voltage.

In one embodiment, during the accelerated programming operation the first pump driver generates the first and second charge pump clock signals having a higher voltage greater than the voltage level of the internal power supply.

In one embodiment, the first pump driver includes a plurality of inverters for generating the first and second charge pump clock signals having a magnitude corresponding to the clock voltage.

In one embodiment, the inverters comprise high-voltage transistors.

In one embodiment, the second voltage generating unit comprises: the second charge pump for performing a charge pumping operation in response to a clock signal; a second pump driver for controlling the phase and magnitude of the clock signal; a second level detector for detecting an output level of the second charge pump to control the applying of the clock signal to the second pump driver; and a second regulator for maintaining an output level of the second charge pump constant. In this case, the external power supply voltage is directly outputted to the second regulator during the accelerated programming operation.

In another aspect of the present invention, a voltage generating circuit comprises: a first voltage generating unit for generating a negative voltage through a first charge pump; and a second voltage generating unit for generating a positive voltage through a second charge pump, wherein the first voltage generating unit increases a pumping efficiency of the first charge pump using an externally-supplied voltage, and the second voltage generating unit directly outputs the externally-supplied voltage during an accelerated programming operation.

In yet another aspect of the present invention, a voltage generating circuit comprises: a charge pump for performing a charge pumping operation in response to a clock signal; a regulator for setting a clock voltage; a pump driver for controlling a phase and magnitude of the clock signal in response to the clock voltage; and a level detector for detecting an output level of the charge pump to control an applying of the clock signal to the pump driver, wherein, during an accelerated programming operation, the regulator raises the clock voltage to a set level using an external power supply voltage, and the pump driver controls a magnitude of the clock signal to correspond to the clock voltage.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
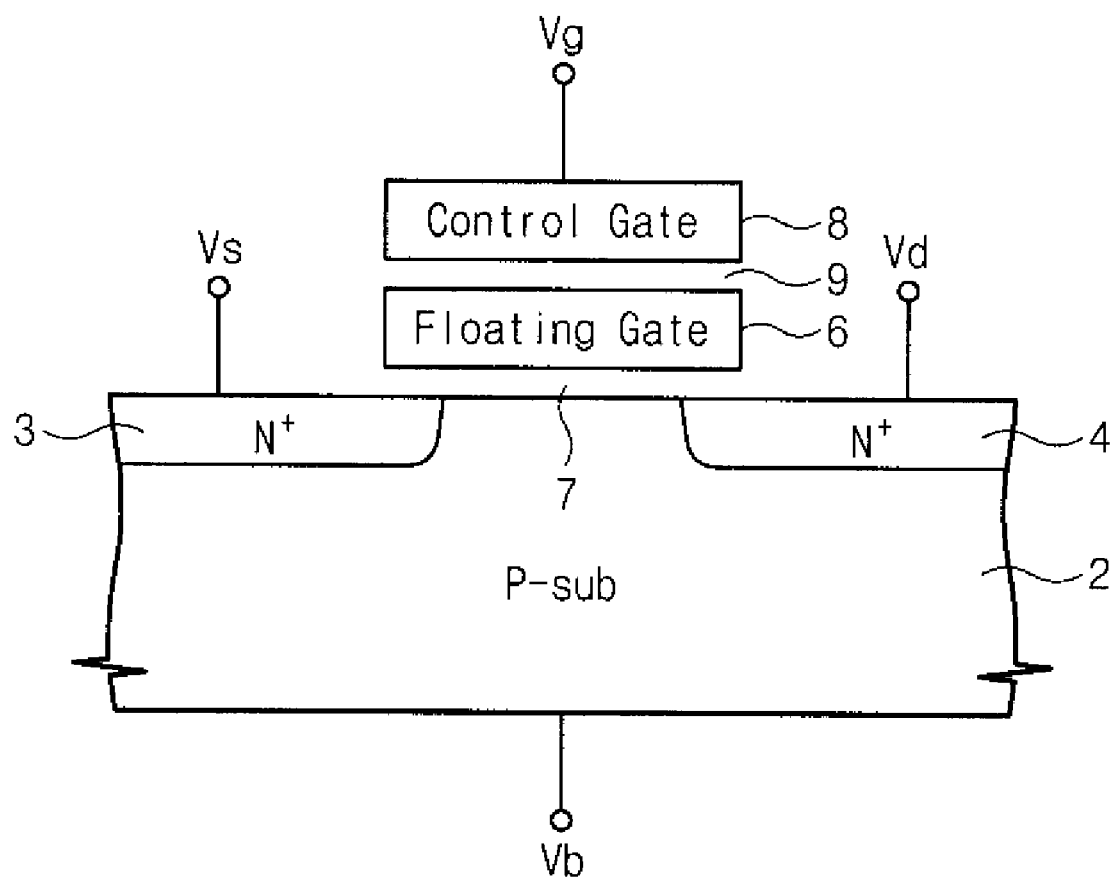
FIG. 1 is a cross-sectional view of a flash memory cell.

Hereinafter, example embodiments of the present invention will be described in detail with reference to the accompanying drawings.

The same reference numerals are used to denote the same elements throughout the drawings.

As disclosed in further detail below, a nonvolatile semiconductor memory device includes a memory cell array formed by a plurality of memory cells and a voltage generating circuit for generating a programming voltage to be applied to memory cells to be programmed. The voltage generating circuit includes a first voltage generating unit for generating a negative voltage through a first charge pump, and includes a second voltage generating unit for generating a positive voltage through a second charge pump. During an accelerated programming operation, the first voltage generating unit increases a pumping efficiency of the first charge pump using an external voltage, and the second voltage generating unit directly outputs the external voltage. As a result, during an accelerated programming operation requiring a large amount of current, it is possible to efficiently increase a capacity of the charge pump without adding an additional circuit.

Figure 3:
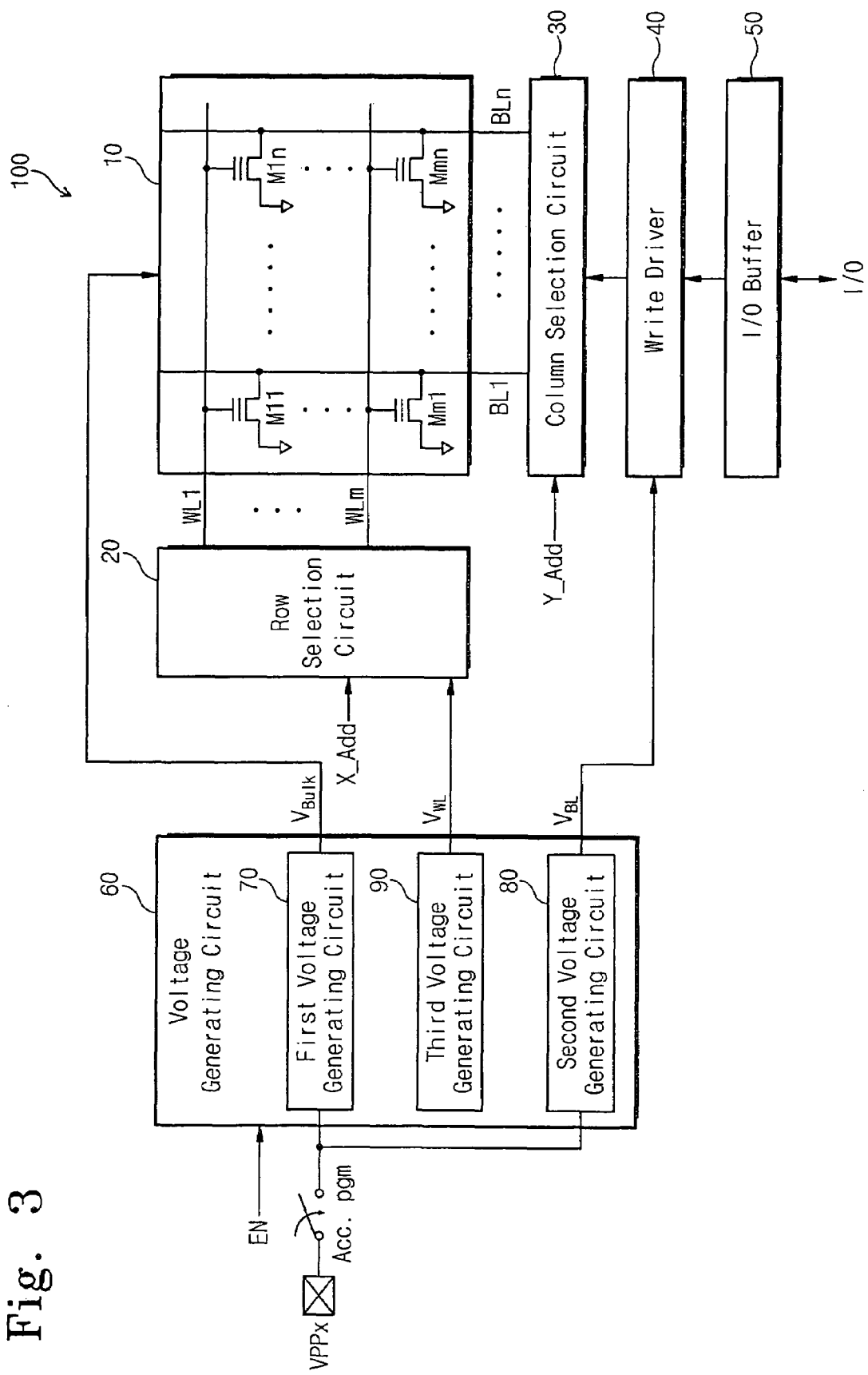
FIG. 3 is a block diagram of one embodiment of a nonvolatile semiconductor memory device.

FIG. 3 is a block diagram showing one embodiment of a nonvolatile semiconductor memory device 100. The nonvolatile semiconductor device 100 of FIG. 3 is a NOR-type flash memory device, and peripheral circuits related with a programming operation are shown.

Referring to FIG. 3, the nonvolatile semiconductor memory device 100 includes a memory cell array 10, a row selection circuit 20, a column selection circuit 30, a write driver 40, an I/O buffer 50, and a voltage generating circuit 60.

The memory cell array 10 is formed by cells having a structure as shown in FIG. 1. The I/O buffer 50 stores data to be written in the memory cell array 10 during a programming operation, and data sensed from the memory cell array 10 during a reading operation. The write driver 40 performs a programming operation with respect to the memory cell using data inputted from the I/O buffer 50. And, the column selection circuit 30 selects a bitline BLi of a cell to be programmed in response to an externally-supplied address Y_Add.

A programming operation performed in the nonvolatile semiconductor memory device 100 is classified into a normal programming operation and an accelerated programming operation. During the accelerated programming operation, 16-bit data is programmed at one time. The accelerated programming operation is performed in a factory circumstance.

The voltage generating circuit 60 includes first to third voltage generating units 70-90. The voltage generating circuit 60 generates a plurality of programming voltages VBulk, VBL, and VWL to be used in programming by the first to third voltage generating units 70-90. During a normal programming operation, a bulk voltage of about −0.5V is generated, a bitline voltage of about 4.2V is generated. And, a wordline voltage of about 10V is generated.

During the accelerated programming operation, the voltage generating circuit 60 directly receives an externally-applied high voltage VPPx to generate the bitline voltage VBL and bulk voltage VBulk to be used in programming. During the accelerated programming operation, a plurality of memory cells are programmed simultaneously, thereby dramatically increasing a current amount to be applied to the bitline. As a current of the bitline becomes increased, a sub-current amount to be leaked out to the bulk is also increased. In order to provide sufficient capacity for the increased bitline current and sub-current, the bitline voltage VBL and the bulk voltage VBulk are generated using the external power supply voltage VPPx during the accelerated programming operation. At this time, as in the normal programming operation, the wordline voltage VWL is generated using a voltage VCC. As a matter of convenience, operations for generating the bulk voltage VBulk and the bitline voltage VBL will be explained, while an operation for generating the wordline voltage VWL is omitted.

The first and second voltage generating units 70 and 80 are similar in that they generate the bulk voltage VBulk and the bitline voltage VBL using an externally-supplied high voltage VPPx during an accelerated programming operation. However, there is a difference as follows.

The first voltage generating unit 70 increases a pumping efficiency by performing a charge pumping with respect to an externally-supplied high voltage during the accelerated programming operation. On the other hand, the second voltage generating unit 80 directly outputs to the bitline voltage VBL the externally-supplied high voltage VPPx during the accelerated programming operation. As a result, a voltage level outputted from the second voltage generating unit 80 is dramatically increased to a level that is sufficient to perform the accelerated programming operation. These differences are caused because the first and second voltage generating units 70 and 80 are different from each other. In that regard, the first voltage generating unit 70 has a negative charge pump circuit for providing a negative voltage to a bulk region in programming, and the second voltage generating unit 80 has a positive charge pump circuit for providing a positive voltage to a selected bitline in programming. For example, if the second voltage generating unit 80 directly outputs the high voltage VPPx applied from the exterior to the bitline voltage VBL in programming, a capacity of a charge pump can be increased through a simple operation for applying an external voltage to an output terminal of the charge pump without an additional circuit. This, however, is not directly applicable to a negative charge pump circuit such as the first voltage generating unit 70. Accordingly, the first voltage generating unit 70 controls the level of a clock signal used in a charge pumping through an externally-applied high voltage VPPx, instead of directly applying the high voltage VPPx. Through this process, the first voltage generating unit 70 increases a pumping efficiency of a charge pump circuit.

As mentioned above, the accelerated programming operation is performed in a factory setting so as to reduce a programming time of a NOR-type flash memory. Thus, the voltages of the first and second voltage generating units 70 and 80 according to the accelerated programming operation are simply controlled by applying the external power supply voltage in the factory setting. In this case, no additional circuit for increasing a capacity of a charge pump is added, with the exception of a construction for connecting the externally-supplied voltage. Therefore, it is possible to provide a sufficient current capacity required during the accelerated programming operation without increasing a chip size.

Figure 4:
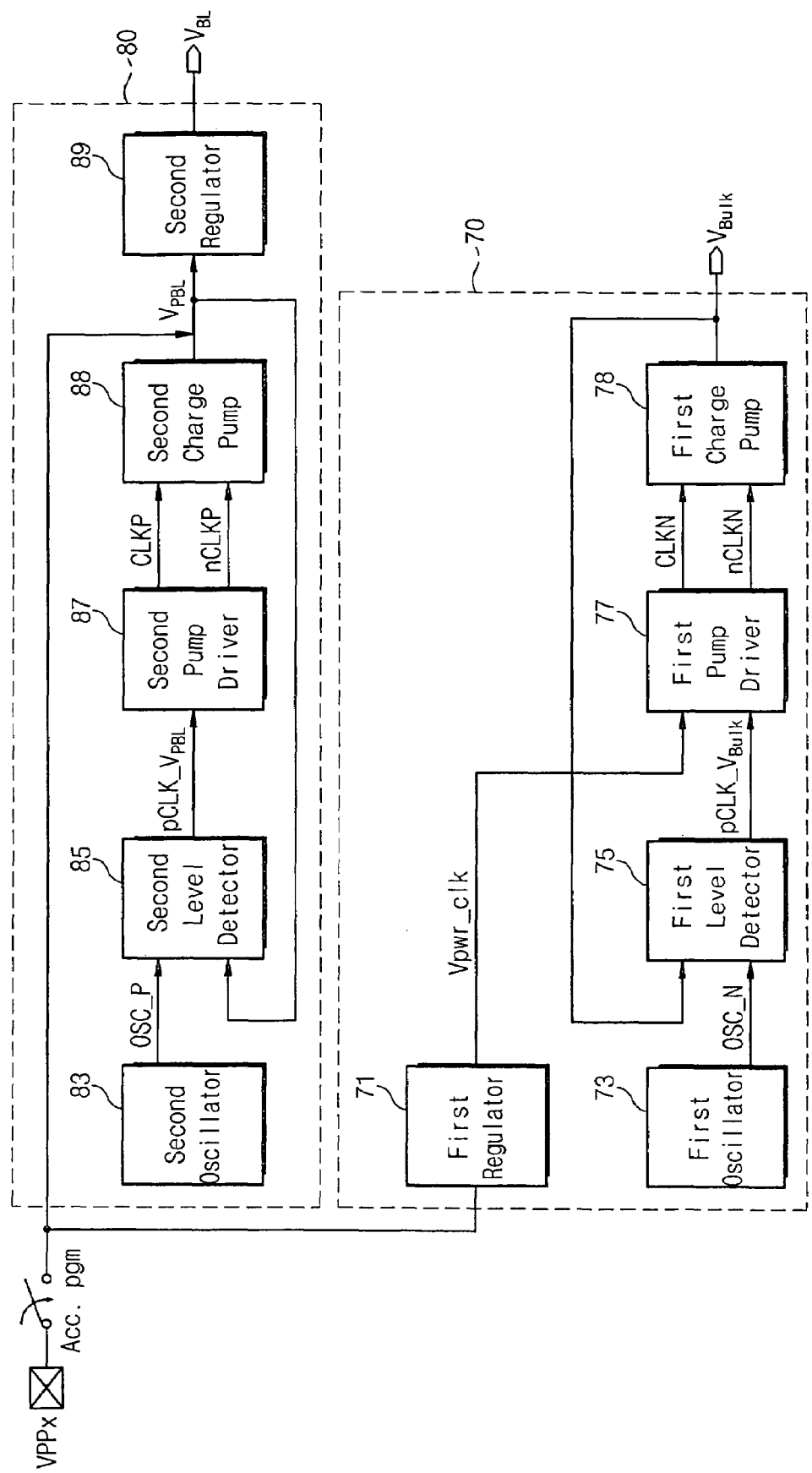
FIG. 4 is a detailed block diagram of first and second voltage generating units of FIG. 3.

FIG. 4 is a detailed block diagram of the first and second voltage generating units 70 and 80 of FIG. 3.

Referring to FIG. 4, first voltage generating unit 70 includes a first regulator 71, a first oscillator 73, a first level detector 75, a first pump driver 77, and a first charge pump 78.

First oscillator 73 generates a first oscillator clock signal OSC_N having a constant period. The first oscillator clock signal OSC_N generated from first oscillator 73 is applied to first level detector 75. First level detector 75 detects an output level of first charge pump 78. First level detector 75 gates the first oscillator clock signal OSC_N according to the detection result and outputs a gated first oscillator clock signal pCLK_VBulk to first pump driver 77. For example, if the detected output level of first charge pump 78 is less than a predetermined reference voltage, then the gated first oscillator clock signal pCLK_VBulk corresponds to the first oscillator clock signal OSC_N and accordingly the first oscillator clock signal OSC_N is applied to first pump driver 77. If the detected output level of first charge pump 78 is greater than the predetermined reference voltage, then the gated first oscillator clock signal pCLK_VBulk does not correspond to the first oscillator clock signal OSC_N (e.g., it remains at a fixed level) and accordingly the first oscillator clock signal OSC_N is not applied to first pump driver 77.

First regulator 71 sets a voltage level Vpwr_clk to be used in generating first and second charge pump clock signals CLKN and nCLKN. For example, first regulator 71 sets Vpwr_clk to correspond to an internal power supply voltage VCC during a normal programming operation. During an accelerated programming operation, first regulator 71 sets Vpwr_clk to have a higher voltage level than the internal power supply voltage VCC (e.g., 2 VCC) in response to an external power supply voltage VPPx. The voltage Vpwr_clk determined by first regulator 71 is provided to first pump driver 77. First pump driver 77 receives the gated first oscillator clock signal pCLK_VBulk from first level detector 75 and the clock voltage Vpwr_clk from first regulator 71. First pump driver 77 controls the phase and magnitude of the gated first oscillator clock signal pCLK_VBulk in response to the clock voltage Vpwr_clk, and generates first and second clock signals CLKN and nCLKN as outputs. The first and second charge pump clock signals CLKN and nCLKN have opposite phases to each other. First charge pump 78 performs a charge pumping operation in response to the first and second charge pump clock signals CLKN and nCLKN, which are generated from first pump driver 77. An output signal of first charge pump 78 is fed back to first level detector 75 and at the same time, applied to a bulk region of memory cell array 10.

Figure 5:
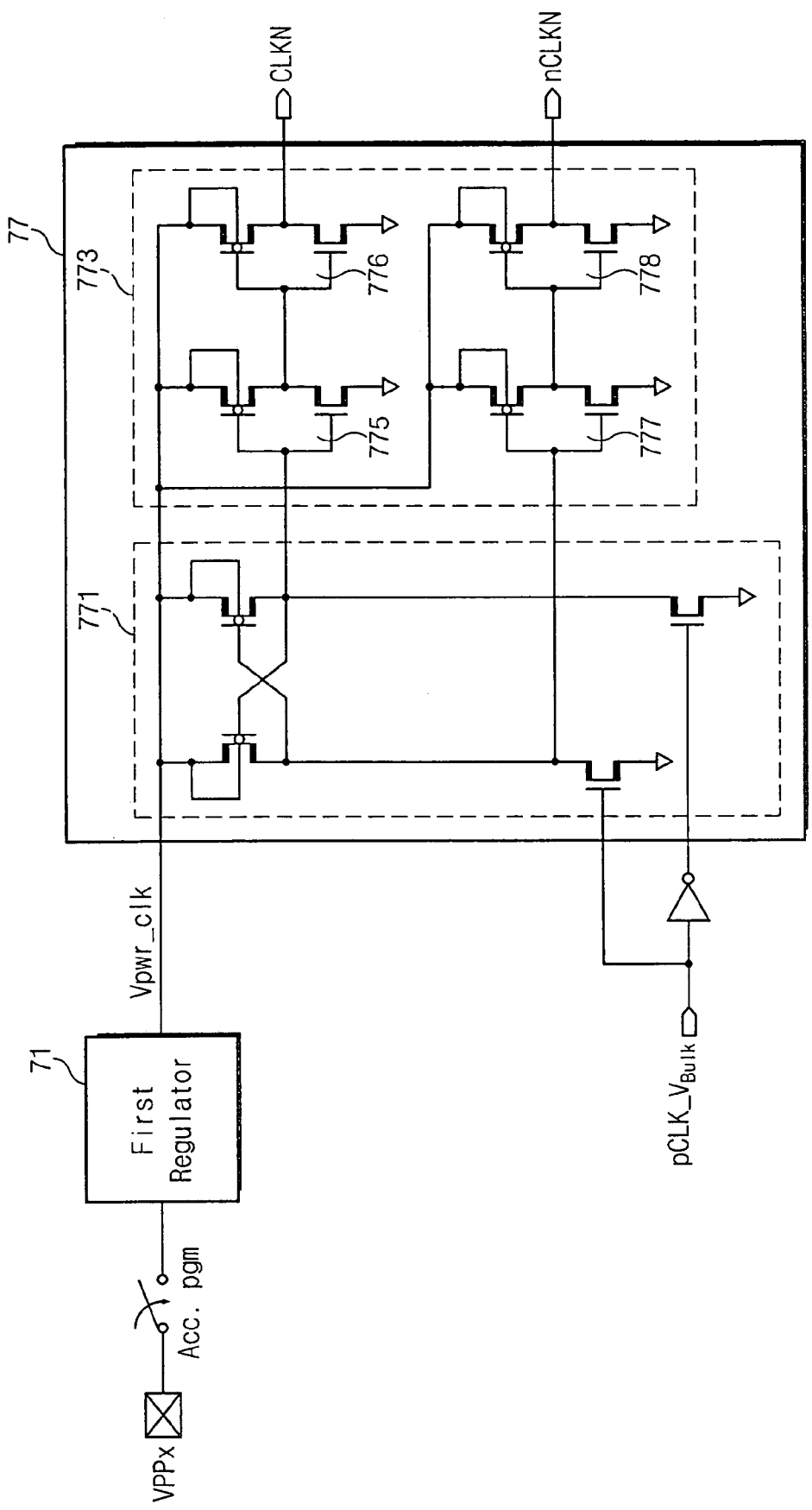
FIG. 5 is a detailed circuit diagram of a first pump driver of FIG. 4.

FIG. 5 is a detailed circuit diagram of first pump driver 77 of FIG. 4.

Referring to FIG. 5, first pump driver 77 includes a clock driver 771 and a clock generating unit 773. Clock driver 771 includes a level shifter, and clock generating unit 773 includes a plurality of inverters 775-778.

Clock driver 771 receives the voltage Vpwr_clk of from first regulator 71, and receives the gated first oscillator clock signal pCLK_VBulk from first level detector 75. Clock driver 771 is synchronized with the gated first oscillator clock signal pCLK_VBulk to supply Vpwr_clk to clock generating unit 773. Clock generating unit 773 is synchronized with the gated first oscillator clock signal pCLK_VBulk to generate the first and second charge pump clock signals CLKN and nCLKN, which correspond to the magnitude of Vpwr_clk. Each of inverters 775-778 comprises a P-type transistor in which a current path is serially connected, and an N-type transistor. The MOS transistors are formed by high voltage transistors that are well known in those skilled in the art. Inverters 775-778 receive the clock voltage Vpwr_clk generated from first regulator 71 and generate the first and second charge pump clock signals CLKN and nCLKN having different phases in synchronization with the gated first oscillator clock signal pCLK_VBulk inputted from first regulator 71. In this case, the cycle of the first and second charge pump clock signals CLKN and nCLKN is controlled by the gated first oscillator clock signal pCLK_VBulk inputted from first regulator 71. The magnitude of the first and second charge pump clock signals CLKN and nCLKN is controlled by the voltage Vpwr_clk inputted from first regulator 71. In this case, Vpwr_clk transferred to clock generating unit 773 has an internal power supply voltage VCC during a normal programming operation, and has a higher level (e.g., 2VCC) than the internal power supply voltage VCC during an accelerated programming operation.

Figure 6:
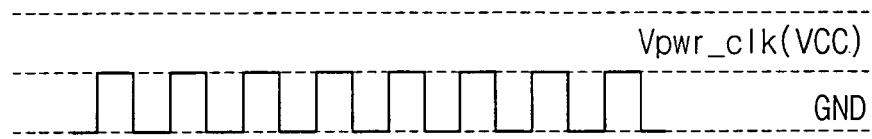
FIG. 6 is an output waveform of the first pump driver of FIG. 5.
Figure 6:
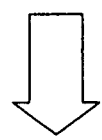
Figure 6:
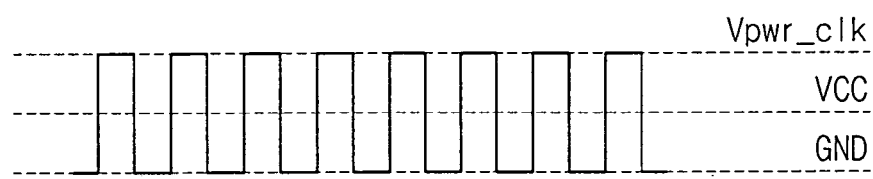

FIG. 6 is an output waveform of first pump driver 77 of FIG. 5.

Figure 7:
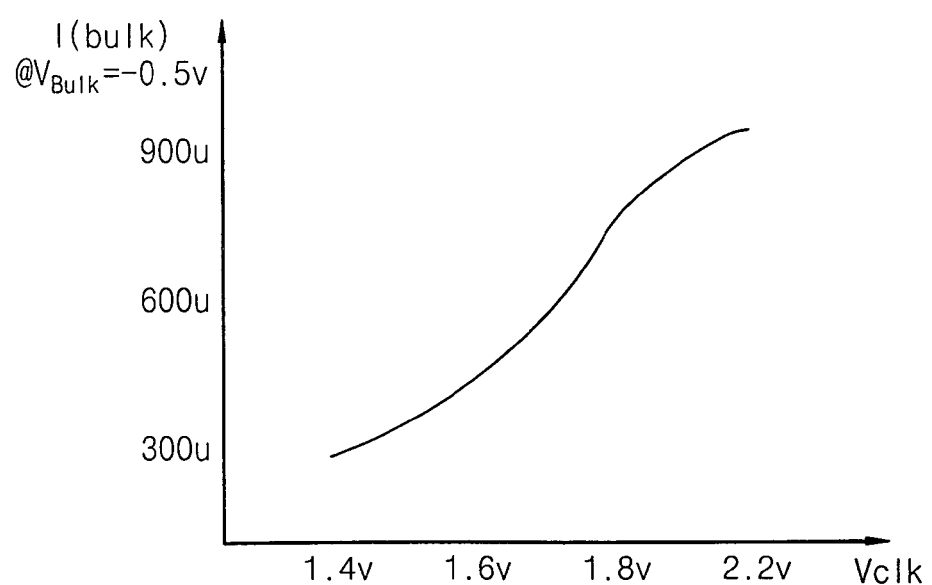
FIG. 7 shows a capacity variation of a first charge pump according to an output level of the first pump driver of FIG. 5.

Referring to FIG. 6, the first and second clock charge pump signals CLKN and nCLKN generated from first pump driver 77 are generated in response to the clock voltage Vpwr_clk having the level of the internal power supply voltage VCC inputted from first regulator 71 during a normal programming operation. At this time, the first and second charge pump clock signals CLKN and nCLKN are toggled between a ground voltage GND and the clock voltage Vpwr_clk (that is, the internal power supply voltage VCC). During an accelerated programming operation, the first and second charge pump clock signals CLKN and nCLKN are generated in response to the clock voltage Vpwr_clk having a higher level, e.g., 2VCC, than the internal power supply voltage VCC. In this case, the first and second charge pump clock signals CLKN and nCLKN are toggled between the ground voltage GND and the voltage Vpwr_clk. As shown in FIG. 7, the pumping efficiency of charge pump 78 is increased as the toggled voltages of the first and second clock signals CLKN and nCLKN are increased. As a result, a negative capacity of a bulk voltage VBulk generated from first charge pump 78 is increased, so that a sub-current can be provided sufficiently.

FIG. 7 shows a variation of a capacity of first charge pump 78 according to an output level of first pump driver 77 of FIG. 5.

Referring to FIG. 7, a pumping capacity of first charge pump 78 is increased in proportion to a voltage level of a clock signal. As shown in FIG. 6, if the voltage level of the first and second charge pump clock signals CLKN and nCLKN is increased from a VCC level to a VPPx level, the pumping capacity of first charge pump 78 is also increased proportionally. Thus, the pumping capacity of first charge pump 78 in voltage generating circuit 60 can be increased by just applying the external power supply voltage VPPx to first regulator 71 instead of the internal power supply voltage VCC without any additional circuits during an accelerated programming operation.

Referring still to FIG. 4, second voltage generating unit 80 includes a second oscillator 83, a second level detector 85, a second pump driver 87, a second charge pump 88, and a second regulator 89.

Second oscillator 83 generates a second oscillator clock signal OSC_P having a regular cycle. The second oscillator clock signal OSC_P generated from second oscillator 83 is inputted to second level detector 85. Second level detector 85 detects an output level of second charge pump 88. Second level detector 85 gates the second oscillator clock signal OSC_P and outputs a gated second oscillator clock signal pCLK_VPBL to second pump driver 87, according to the detection result. For example, if the detected output level of second charge pump 88 is less than a predetermined reference voltage, then the second level detector 85 outputs the gated second oscillator clock signal pCLK_VPBL to the second pump driver 87. In contrast, if the detected output level of second charge pump 88 is greater than the predetermined reference voltage, then the second level detector 85 does not outputs the gated second oscillator clock signal pCLK_VPBL to the second pump driver 87. In this case, the second voltage generating unit 80 does not perform pumping operation.

Figure 2:
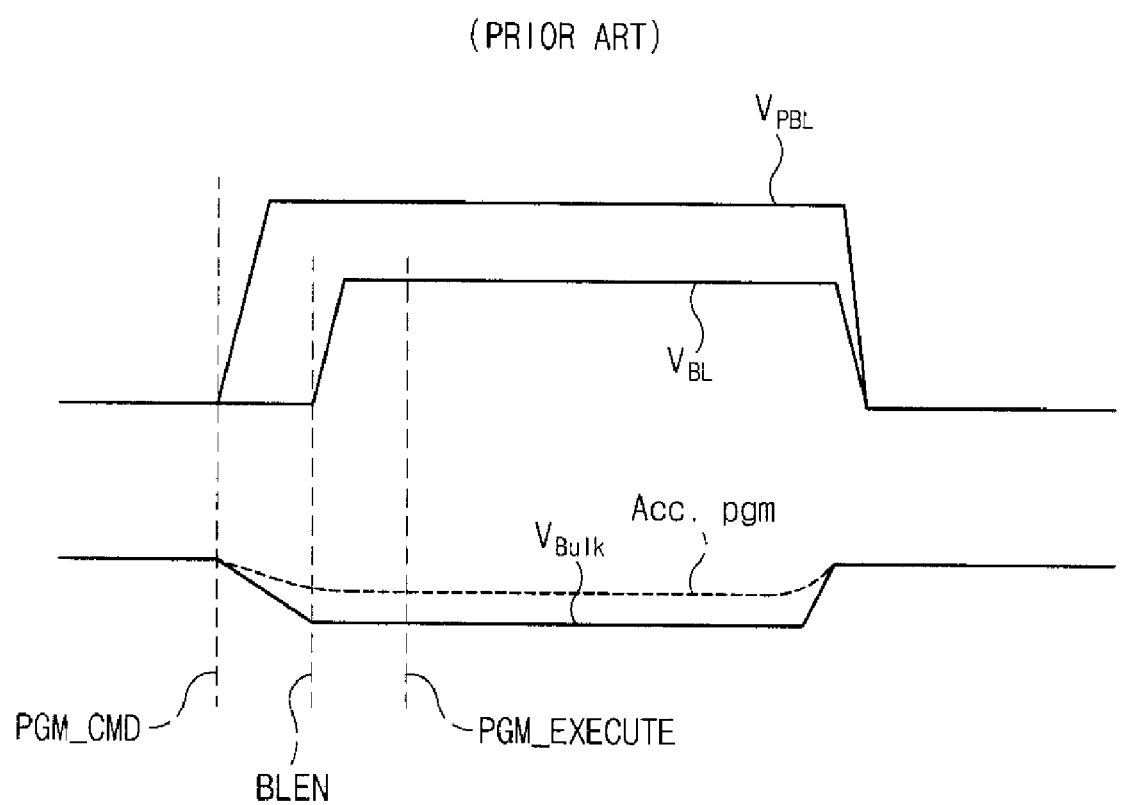
FIG. 2 a waveform showing a programming voltage of a NOR-type flash memory device.

Second pump driver 87 controls a phase of the gated second oscillator clock signal pCLK_VPBL inputted from second level detector 85, and generates third and fourth charge pump clock signals CLKP and nCLKP as output signals. The third and fourth charge pump clock signals CLKP and nCLKP have opposite phases with respect to each other. Second charge pump 88 performs a charge pump operation in response to the third and fourth charge pump clock signals CLKP and nCLKP from second pump driver 87. An output signal VPBL of second charge pump 88 is fed-back to second level detector 85 and at the same time, is applied to second regulator 89. Second regulator 89 regulates the pumping voltage VPBL supplied from second charge pump 88 to a bitline voltage VBL having a constant level. In this case, the regulated bitline voltage VBL, as shown in FIG. 2, has a lesser voltage level than the pumping voltage VPBL. The bitline voltage VBL generated from second regulator 89 is applied to a selected bitline in a programming operation.

During a normal programming operation, the output signal VPBL of second charge pump 88 is generated using the internal power supply voltage VCC. The output signal VPBL of second charge pump 88 is fed-back to second level detector 85 and at the same time, is used to generate the bitline voltage VBL through second regulator 89. In this case, the external power supply voltage VPPx does not influence generation of the bitline voltage VBL of second voltage generating unit 80.

On the other hand, during an accelerated programming operation requiring a high pumping efficiency, the external power supply voltage VPPx is directly applied to an output terminal of second charge pump 88, thereby dramatically increasing an output level of second charge pump 88. The output signal VPBL is fed-back to second level detector 85 and at the same time, is applied to second regulator 89. The second level detector 85 detects whether the output level of second charge pump 88 is greater than a predetermined reference voltage. In this case, the output signal VPBL of second charge pump 88 is greater than the predetermined reference voltage. Thus, the second level detector 85 does not outputs the gated second oscillator clock signal pCLK_VPBL, and both the second pump driver 87 and the second charge pump 88 perform can not any operation. Therefore, the second charge pump 88 directly outputs the external power supply voltage VPPx as the output signal VPBL. As a result, it is possible to provide a sufficient current capacity required during the accelerated programming operation without increasing the chip size.

As mentioned above, an accelerated programming operation is carried out in a factory setting so as to reduce a programming time of a NOR-type flash memory. Thus, as disclosed above, a programming voltage is generated using an internal power supply voltage VCC, and an external power supply voltage VPPx, during a normal programming operation and an accelerated programming operation, respectively. Thus, a chip size is not increased and the normal programming operation is not affected by the accelerated programming operation. Particularly, when generating a bulk voltage using a negative charge pump, the external power supply voltage VPPx is used to improve the pumping efficiency. When generating a bitline voltage using a positive charge pump, the external power supply voltage VPPx is outputted as it is. Accordingly, during an accelerated programming operation for requiring a large amount of current capacity, the capacity of the charge pump can be increased efficiently without additional circuits. As such, a programming voltage is stably provided, so that a programming non-volatile semiconductor memory device is improved.

Thus, a sufficient current capacity can be provided to perform an accelerated programming operation without increasing a chip size. As a result, a programming reliability of a non-volatile semiconductor memory device is improved.

The embodiments of the voltage generating circuit are described in the case of a programming voltage for non-volatile semiconductor memory devices such as flash memories. It is noted, however, that the method for increasing a pumping efficiency is equally applicable to other memory devices, as well as non-volatile semiconductor memory devices. Also, the method is applicable to a programming voltage as well as an erase voltage. Such variations are not to be regarded as departure from the scope of the present invention, and all such modifications as would be obvious to one skilled in the art are intended to be included within the scope of the following claims.

What is claimed is:

1. A nonvolatile semiconductor memory device comprising:
    a memory cell array of a plurality of memory cells; and
    a voltage generating circuit for generating a programming voltage to be applied to the memory cells,
        wherein the voltage generating circuit includes:
        a first voltage generating unit for generating a negative voltage through a first charge pump; and
        a second voltage generating unit for generating a positive voltage through a second charge pump, and
        wherein during an accelerated programming operation, the first voltage generating unit increases a pumping efficiency of the first charge pump using an external voltage, and the second voltage generating unit directly outputs the external voltage.

2. The nonvolatile semiconductor memory device of claim 1, wherein the negative voltage is applied to a bulk region of the memory cell array.

3. The nonvolatile semiconductor memory device of claim 1, wherein the voltage generating circuit further includes a third voltage generating unit for generating a voltage applied to a selected wordline of the memory cell array.

4. The nonvolatile semiconductor memory device of claim 1, wherein the first voltage generating unit comprises:
    the first charge pump for performing a charge pumping operation in response to a clock signal;
    a first regulator for setting a clock voltage;
    a first pump driver for controlling a phase and a magnitude of the clock signal; and
    a first level detector for detecting an output level of the first charge pump to control an applying of the clock signal to the first pump driver,
    wherein the first regulator raises the clock voltage to a set level using an external voltage, and the first pump driver controls the magnitude of the clock signal to correspond to the clock voltage during the accelerated programming operation.

5. The nonvolatile semiconductor memory device of claim 1, wherein the second voltage generating unit comprises:
    the second charge pump for performing a charge pumping operation in response to a clock signal;
    a second pump driver for controlling the phase and magnitude of the clock signal; and
    a second level detector for detecting an output level of the second charge pump to control an applying of the clock signal to the second pump driver; and
    a second regulator for maintaining an output level of the second charge pump constant,
    wherein the external voltage is directly outputted to the second regulator during the accelerated programming operation.

6. The nonvolatile semiconductor memory device of claim 2, wherein the positive voltage is applied to a selected bitline of the memory cell array.

7. The nonvolatile semiconductor memory device of claim 4, wherein the first pump driver outputs the clock signal as complementary first and second charge pump clock signals having opposite phases with respect to each other.

8. The nonvolatile semiconductor memory device of claim 7, wherein, during a normal programming operation, the first pump driver generates the first and second charge pump clock signals having a magnitude corresponding to an internal power supply voltage.

9. The nonvolatile semiconductor memory device of claim 7, wherein, during the accelerated programming operation, the first pump driver generates the first and second charge pump clock signals having a voltage level greater than that of an internal power supply voltage.

10. The nonvolatile semiconductor memory device of claim 7, wherein the first pump driver includes a plurality of inverters for generating the first and second charge pump clock signals having a magnitude corresponding to the clock voltage.

11. The nonvolatile semiconductor memory device of claim 10, wherein the inverters comprise high-voltage transistors.

12. The nonvolatile semiconductor memory device of claim 5, wherein the second driver outputs the clock signal as complementary third and fourth charge pump clock signals having opposite phases with respect to each other.

13. The nonvolatile semiconductor memory device of claim 5, wherein the third and fourth outputs the clock signal as complementary clock signals have a magnitude corresponding to an internal power supply voltage.

14. A voltage generating circuit comprising:
    a first voltage generating unit for generating a negative voltage through a first charge pump; and
    a second voltage generating unit for generating a positive voltage through a second charge pump,
    wherein the first voltage generating unit increases a pumping efficiency of the first charge pump using an externally-supplied voltage, and the second voltage generating unit directly outputs the externally-supplied voltage during an accelerated programming operation.

15. The voltage generating circuit of claim 14, wherein the first voltage generating unit comprises:
   the first charge pump for performing a charge pumping operation in response to a clock signal;
   a first regulator for selling a clock voltage;
   a first pump driver for controlling a phase and a magnitude of the clock signal; and
   a first level detector for detecting an output level of the first charge pump to control an applying of the clock signal to the first pump driver,
   wherein, during the accelerated programming operation, the first regulator raises the clock voltage to a set level using an externally-supplied voltage, and the first pump driver controls the magnitude of the clock signal to correspond to the clock voltage.

16. The voltage generating circuit of claim 14, wherein the second voltage generating unit comprises:
   the second charge pump for performing a charge pumping operation in response to a clock signal;
   a second pump driver for controlling the phase and the magnitude of the clock signal;
   a second level detector for detecting an output level of the second charge pump to control an applying of the clock signal to the second pump driver; and
   a second regulator for maintaining an output level of the second charge pump constant,
   wherein the external voltage is directly outputted to the second regulator during the accelerated programming operation.

17. The voltage generating circuit of claim 15, wherein the first pump driver outputs the clock signal as complementary first and second charge pump clock signals having opposite phases with respect to each other.

18. The voltage generating circuit of claim 17, wherein, during a normal programming operation, the first pump driver generates the first and second charge pump clock signals having a magnitude corresponding to an internal power supply voltage.

19. The voltage generating circuit of claim 17, wherein, during the accelerated programming operation, the first pump driver generates the first and second charge pump clock signals having a voltage level greater than that of an internal power supply voltage.

20. The voltage generating circuit of claim 17, wherein the first pump driver includes a plurality of inverters for generating the first and second charge pump clock signals having a magnitude corresponding to the clock voltage.

21. The voltage generating circuit of claim 20, wherein the inverters comprise high voltage transistors.

22. The voltage generating circuit of claim 16, wherein the second pump driver outputs the clock signal as complementary third and fourth charge pump clock signals having opposite phases with respect to each other.

23. The voltage generating circuit of claim 16, wherein the third and fourth clock signals have a magnitude corresponding to an internal power supply voltage.

24. A voltage generating circuit comprising:
   a charge pump for performing a charge pumping operation in response to a clock signal;
   a regulator for selling a clock voltage;
   a pump driver for controlling a phase and magnitude of the clock signal in response to the clock voltage; and
   a level detector for detecting an output level of the charge pump to control an applying of the clock signal to the pump driver,
   wherein, during an accelerated programming operation, the regulator raises the clock voltage to a set level using an external power supply voltage, and the pump driver controls a magnitude of the clock signal to correspond to the clock voltage.

25. The voltage generating circuit of claim 24, wherein the charge pump is a negative charge pump.

26. The voltage generating circuit of claim 24, wherein, during a normal programming operation, the regulator determines the clock voltage using an internal power supply voltage.

27. The voltage generating circuit of claim 24, wherein the pump driver outputs the clock signal as complementary first and second charge pump clock signals having opposite phases with respect to each other.

28. The voltage generating circuit of claim 24, wherein the pump driver includes a plurality of inverters for generating the first and second charge pump clock signals having a magnitude corresponding to the clock voltage.

29. The voltage generating circuit of claim 27, wherein, during a normal programming operation, the pump driver generates the first and second charge pump clock signals having a magnitude corresponding to an internal power supply voltage.

30. The voltage generating circuit of claim 27, wherein, during the accelerated programming operation, the pump driver generates the first and second clock signals having a voltage level greater than that of an internal power supply voltage.

31. The voltage generating circuit of claim 28, wherein the inverters comprise high voltage transistors.

* * * * *